United States Patent [19]
Miehls et al.

[11] Patent Number: 5,249,355
[45] Date of Patent: Oct. 5, 1993

[54] METHOD OF FABRICATING A MULTILAYER ELECTRICAL CIRCUIT STRUCTURE

[75] Inventors: David J. Miehls, Placentia; Felipe J. Martin, Trabuco Canyon; Ramona G. Pond, Downey; Paul S. Fleischner, Long Beach, all of Calif.

[73] Assignee: Hughes Aircraft Company, Los Angeles, Calif.

[21] Appl. No.: 785,859

[22] Filed: Oct. 31, 1991

[51] Int. Cl.$^5$ .............................................. H05K 3/36
[52] U.S. Cl. ...................... 29/830; 156/652; 427/282; 437/209
[58] Field of Search .............. 29/830; 156/652; 427/282; 264/61; 437/209

[56] References Cited
U.S. PATENT DOCUMENTS

| | | | |
|---|---|---|---|
| 2,926,340 | 2/1960 | Blain et al. | 29/830 X |
| 3,588,852 | 6/1971 | McCormack et al. | 29/830 X |
| 3,769,702 | 11/1973 | Scarbrough | 29/830 |
| 3,813,773 | 6/1974 | Parks | 29/830 |
| 4,370,194 | 1/1983 | Shaver et al. | 427/282 X |
| 4,415,403 | 11/1983 | Bakewell | 156/652 X |

Primary Examiner—Carl J. Arbes
Attorney, Agent, or Firm—Elizabeth E. Leitereg; Terje Gudmestad; W. K. Denson-Low

[57] ABSTRACT

An electrically conductive stripline (16) is formed on a thermally fusible sheet (10), with a portion (16a) of the stripline (16) extending adjacent to an edge (10a) of the sheet (10). A cavity (18) is formed in another thermally fusible sheet (12) having an end (18a) at an edge (12a) thereof. The sheets (10,12) are laminated together with their edges (10a,12a) aligned, and the cavity (18) aligned with and facing the edge portion (16a) of the stripline (16). A retaining pin (20) may be temporarily inserted into the cavity (18) to prevent collapse thereof during the lamination step. The laminated sheets (10,12) are heated to thermally fuse them together. An electrically conductive pin (28) is partially inserted into the cavity (18) and ohmically bonded to the stripline (18) to provide an external connection.

10 Claims, 5 Drawing Sheets

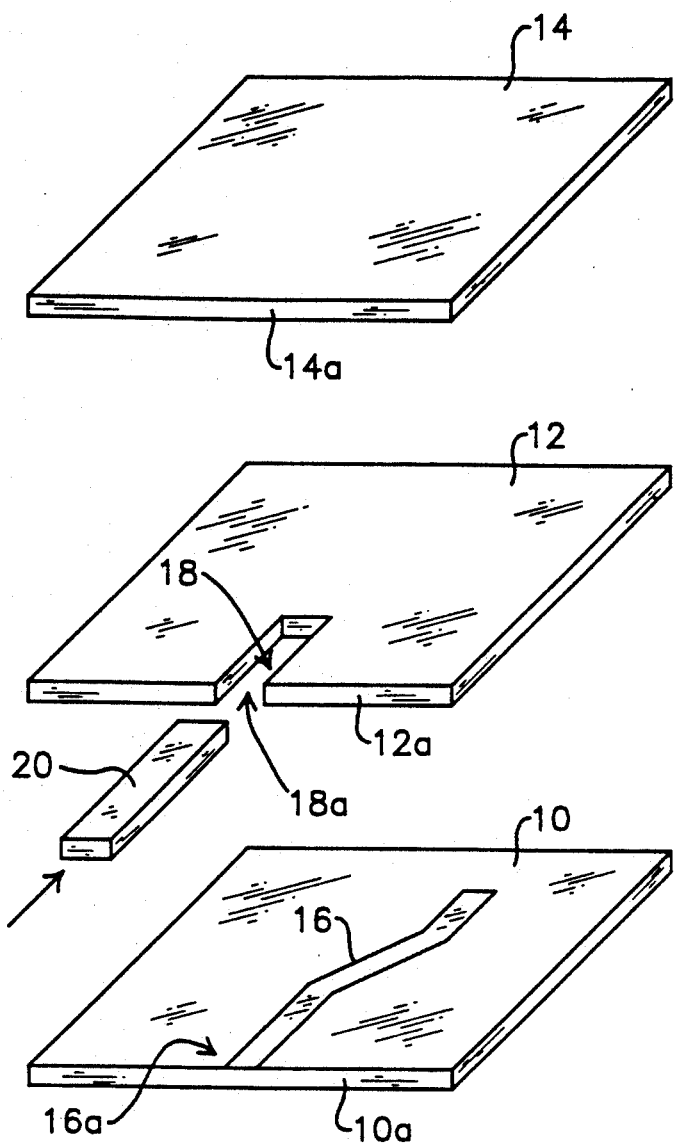
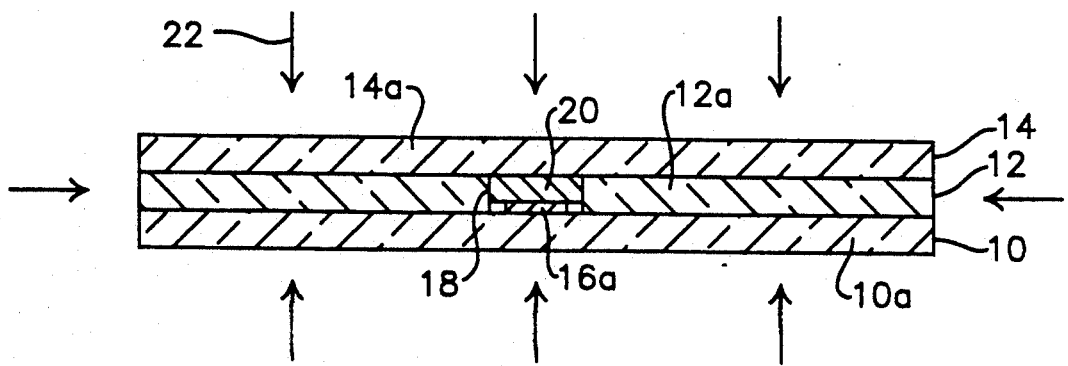
Fig.1
Fig.2

METHOD OF FABRICATING A MULTILAYER ELECTRICAL CIRCUIT STRUCTURE

BACKGROUND OF THE INVENTION

1. Field of the Invention

The present invention generally relates to the art of microelectronics, and more specifically to the fabrication of a multilayer electrical circuit structure including a plurality of laminated layers of thermally fusible tape, and partially embedded pins extending from the structure for external connection.

2. Description of the Related Art

Multilayer substrates for hybrid microcircuits may be advantageously fabricated using a low temperature cofired ceramic process such as described in an article entitled "DEVELOPMENT OF A LOW TEMPERATURE COFIRED MULTILAYER CERAMIC TECHNOLOGY", by William Vitriol et al. ISHM Proceedings 1983, pp. 593-598. This technology utilizes thermally fusible dielectric sheets in the form of Low-Temperature-Cofired-Ceramic (LTCC) tape.

The LTCC tape sheets may be metallized to make a ground plane, signal plane, bonding plane, or the like, or formed with via holes and back filled with metallization to form interconnect layers. Individual sheets of tape are then stacked on each other, laminated together using a predetermined temperature and pressure, and then fired at a desired elevated temperature at which the material fuses or sinters.

A preferred LTCC, which is known in the art as "green tape", is commercially available from the DuPont Company under the product designation #851AT. The tape contains a material formulation which can be a mixture of glass and ceramic fillers which sinter at about 850° C., and exhibits thermal expansion similar to alumina. The low-temperature processing permits the use of air fired resistors and precious metal thick film conductors such as gold, silver, or their alloys.

Multilayer electrical circuit structures made from LTCC are conventionally mounted in packages, and interconnected with other components and modules in the packages by wire bonds. The wire bonding process is disadvantageous in that it is time consuming, labor intensive, has a high defect rate and does not offer latitude in impedance matching the LTCC elements to the other components.

SUMMARY OF THE INVENTION

In accordance with a method of fabricating a multilayer electrical circuit structure embodying the present invention, an electrically conductive stripline is formed on a thermally fusible sheet, with a portion of the stripline extending adjacent to an edge of the sheet. A cavity is formed in another thermally fusible sheet having an end at an edge thereof. The sheets are laminated together with their edges aligned, and the cavity aligned with and facing the edge portion of the stripline.

A retaining pin may be temporarily inserted into the cavity to prevent collapse thereof during the lamination step. The laminated sheets are heated to thermally fuse them together. An electrically conductive pin is partially inserted into the cavity and ohmically bonded to the stripline to provide an external connection. Additional sheets and pins may be added to provide a structure having, for example, multiple rows of pins.

The present invention enables the fabrication of self-contained interconnectable hermetic high frequency LTCC modules, increases the feasibility of module-to-module interconnection, improves circuit performance, and reduces the amount of circuit area currently used for interconnections. The invention also enables module-to-module interconnection over longer distances using cables, and input and output impedance matching between modules.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 1 is a simplified isometric exploded view illustrating an initial step of a first method of fabricating a multilayer electrical circuit structure embodying the present invention;

FIG. 2 is a sectional view illustrating a subsequent step of the first method;

DETAILED DESCRIPTION OF THE INVENTION

Figure 3:
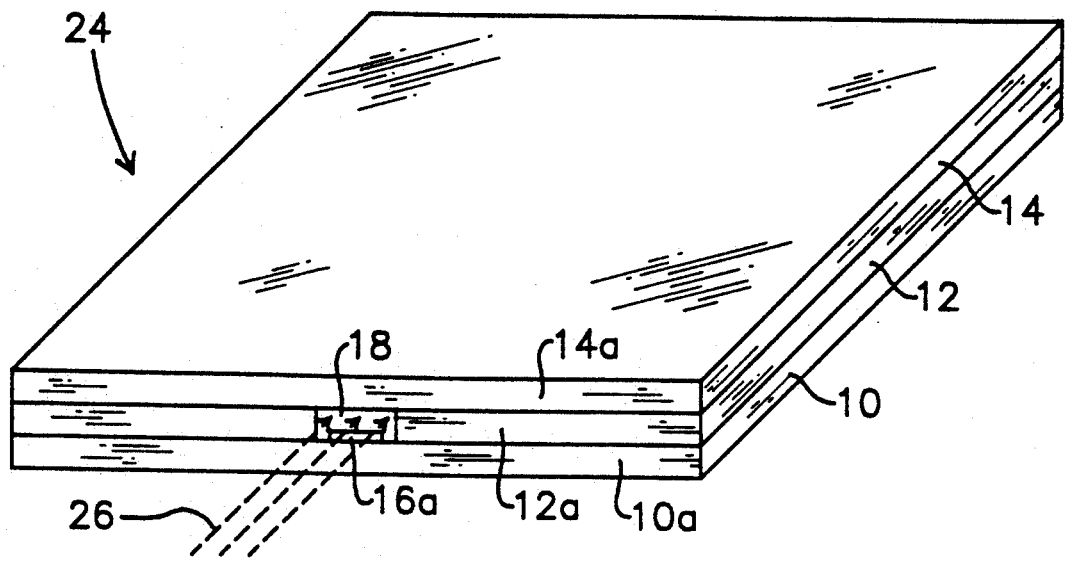
FIGS. 3 and 4 are isometric views illustrating subsequent steps of the first method.

FIGS. 1 to 4 illustrate a first, simplified method of practicing the present invention. As viewed in FIG. 1, a first sheet 10, a second sheet 12 and a third sheet 14 are formed from glass-ceramic LTCC tape as described above, or any other applicable type of thermally fusible tape such as ceramic transfer tape (TTRAN) as disclosed in U.S. Pat. No. 4,645,552, issued Feb. 24, 1987, entitled "PROCESS FOR FABRICATING DIMENSIONALLY STABLE INTERCONNECT BOARDS", to William Vitriol et al.

Although a simplified structure including three layers is sufficient for describing the principles of the invention, a practical structure fabricated in accordance with the present method will typically include many more than three layers. The entire areas of the sheets 10, 12 and 14 are used as circuit areas thereof, having edges 10a, 12a and 14a respectively.

In actual practice, numerous electrical elements including ground planes, resistors, horizontal interconnects or striplines, vertical interconnects (VIAs), etc., will be formed on and through the sheets 10, 12 and 14 to constitute a useful electrical circuit structure. However, only those elements which are necessary for understanding the principles of the invention will be described and illustrated.

An electrically conductive stripline 16 is formed on the sheet 10, having a portion 16a which extends adjacent to the edge 10a. The purpose of the stripline 16 is to provide an external interconnection for the electrical circuit elements (not shown) formed on the sheets 10, 12 and 14. A cavity 18 is formed through the sheet 12 by laser drilling, punching, blanking, etc., preferably extending perpendicular to and having an open end 18a at the edge 12a.

Referring also to FIG. 2, the sheets 10, 12 and 14 are stacked together with the edges 10a, 12a and 14a mutually aligned, and the cavity 18 facing the edge portion 16a of the stripline 16. Although it is necessary that the portion 16a of the stripline 16 and the cavity 18 be aligned with each other, the portion 16a may have the same width as, or be narrower or wider than the cavity 18. A retaining pin 20, which is longer than the cavity 18 and has substantially the same cross-section or profile thereof, is partially inserted into the cavity 18.

The retaining pin 20 may be made of brass or any other material capable of preventing the cavity 18 from collapsing in response to applied pressure and/or heat, and which may be easily removed. The pin 20 is made longer than the cavity 18 so that the protruding portion of the pin 20 may be gripped to facilitate easy removal of the pin 20.

The sheets 10, 12 and 14 are adhered together as viewed in FIG. 2. Where the sheets 10, 12 and 14 are formed from LTCC tape, they may be isostatically laminated together by applying pressure and heat as illustrated by arrows 22. The retaining pin 20 is removed subsequent to lamination, such that the end 18a of the cavity 18 opens external of the laminated sheets 10, 12 and 14.

It will be noted that the retaining pin 20 may not be necessary if the conditions are such that the cavity 18 will not collapse during lamination. This may be the case where a large number of sheets are laminated in sections, and the sections subsequently uniaxially laminated together.

Figure 4:
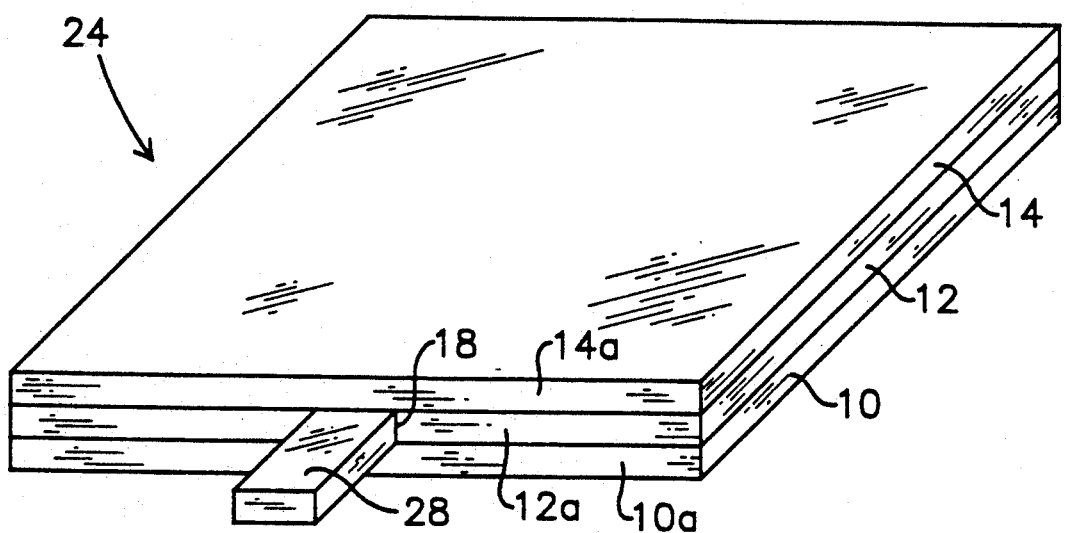

As viewed in FIG. 3, the sheets 10, 12 and 14 are fired at 830° C. to thermally fuse them together and produce an integral multilayer electrical circuit structure 24. An electrically conductive adhesive such as low-loss epoxy resin is injected into the cavity 18 as indicated by arrows 26. Then, as illustrated in FIG. 4, an electrically conductive pin 28 which has substantially the same profile as and is longer than the cavity 18 is partially inserted therein through the open end 18a. The resin is then cured, through application of heat if applicable, to ohmically bond or adhere the pin 28 to the end portion 16a of the stripline 16. The pin 28 is partially embedded in the structure 24, with a portion thereof protruding. It is further within the scope of the invention to ohmically adhere the pin 28 to the stripline 16 using metal fusion, or any other alternative method.

The pin 28 may be formed of any suitable, electrically conductive material such as gold, silver, platinum, etc. and alloys thereof. Although the pin 28 is illustrated as having a rectangular profile, it may be round, oval, vertically elongated, or have any other appropriate shape within the scope of the invention. The pin 28 enables interconnection of the structure 24 with other elements and modules (not shown). The pin 28 may be utilized, for example, as the center conductor of a coaxial cable connector, although not specifically illustrated.

Figure 5:
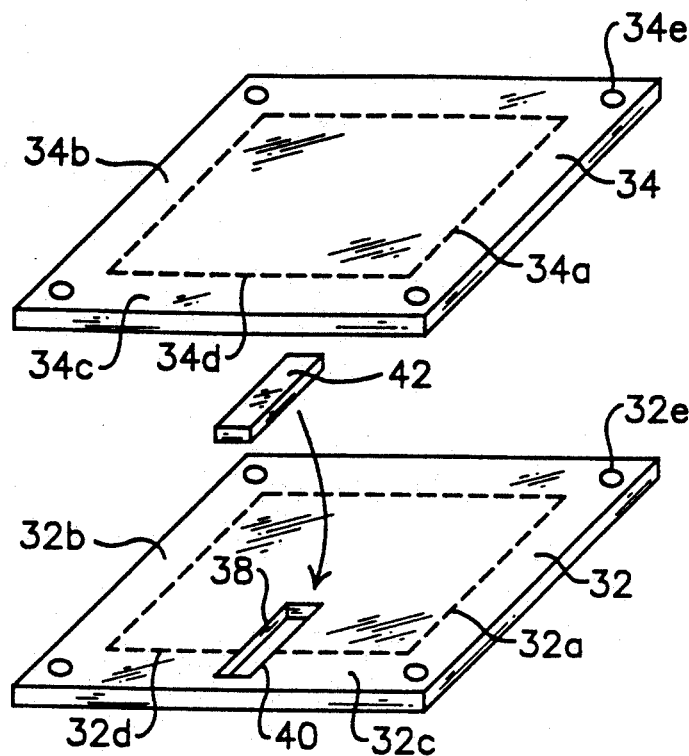
FIG. 5 is a simplified isometric exploded view illustrating an initial step of a second method of fabricating a multilayer electrical circuit structure embodying the present invention.
Figure 5:
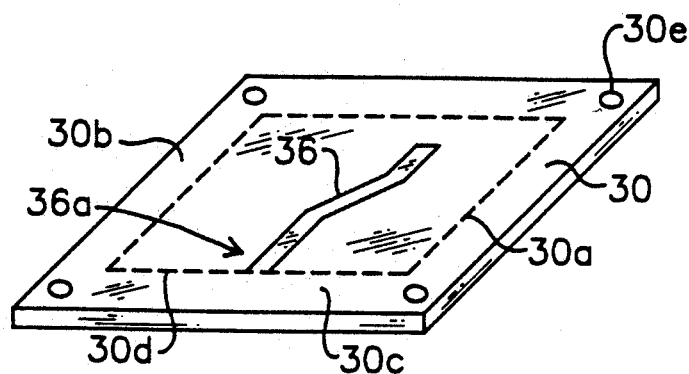

Whereas the entire areas of the sheets 10, 12 and 14 are used as circuit areas in FIGS. 1 to 4, it is within the scope of the invention to provide sheets having sacrificial areas extending outwardly from the circuit areas to facilitate handling, alignment and other fabrication procedures. As illustrated in FIG. 5, first, second and third sheets 30, 32 and 34 have circuit areas indicated as being enclosed by broken lines 30a, 32a and 34a, and sacrificial areas 30b, 32b and 34b extending outwardly from the circuit areas 30a, 32a and 34a respectively. The sacrificial areas 30b, 32b and 34b include areas 30c, 32c and 34c which extend outwardly from edges 30d, 32d and 34d of the circuit areas 34a, 32a and 34a respectively. Further illustrated are alignment holes 30e, 32e and 34e formed through the sacrificial areas 30b, 32b and 34b respectively.

A stripline 36 is formed on the first sheet 30, having a portion 36a extending adjacent to the edge 30d of the circuit area 30a in the same manner as the stripline 16 described above. A cavity 38 is formed through the circuit area 32a the second sheet 32 in the same manner as the cavity 18 described above. In addition, a cavity 40 is formed through the sacrificial area 32c of the sheet 32. The cavity 40 is essentially an extension of the cavity 38 and is preferably formed integrally therewith in a single process step, such that the cavities 38 and 40 are continuous and have ends (not designated) at the edge 32d of the circuit area 32a which open toward each other.

Figure 6:
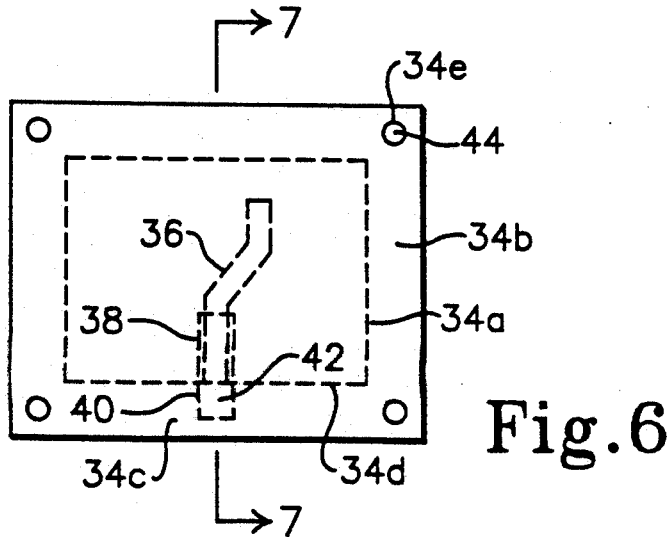
FIG. 6 is a plan view illustrating a subsequent step of the second method.

As further illustrated in FIG. 5, a retaining pin 42 has a length substantially equal to the combined length of the cavities 38 and 40, and is inserted into the cavities 38 and 40 to prevent collapse thereof during lamination as described above. FIG. 6 illustrates the sheets 30, 32 and 34 stacked together for lamination, with alignment pins 44 of a laminating fixture (not shown) protruding through the holes 30e, 32e and 34e.

Figure 7:
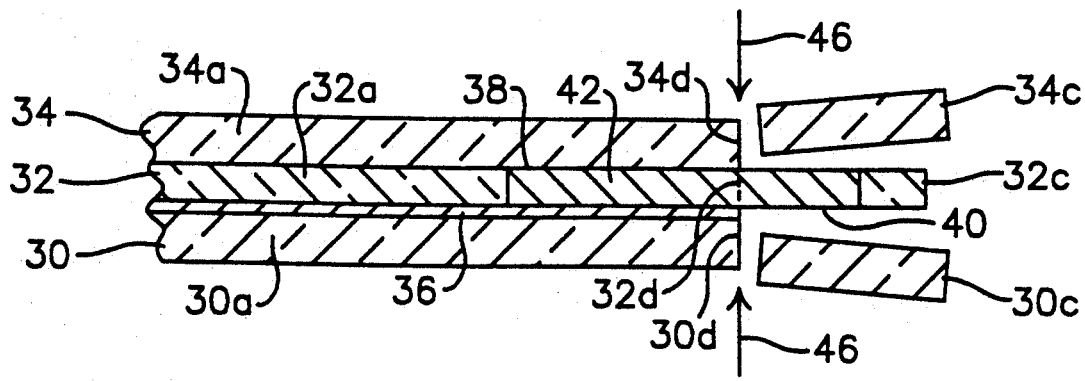
FIGS. 7, 8 and 9 are fragmentary sectional views taken on a line 7—7 of FIG. 6 illustrating subsequent steps of the second method.
Figure 8:
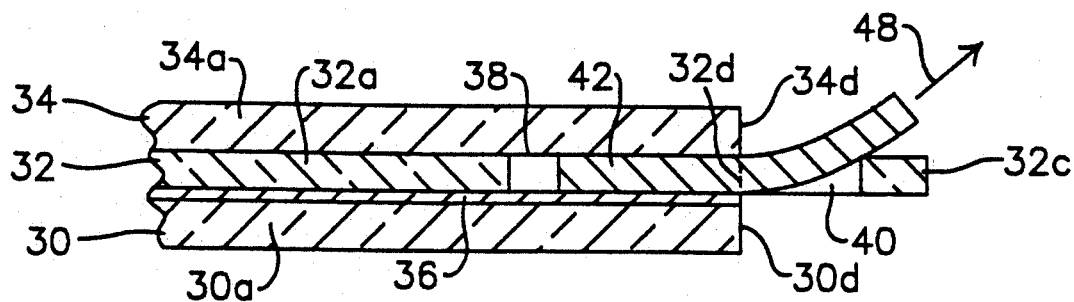
Figure 9:
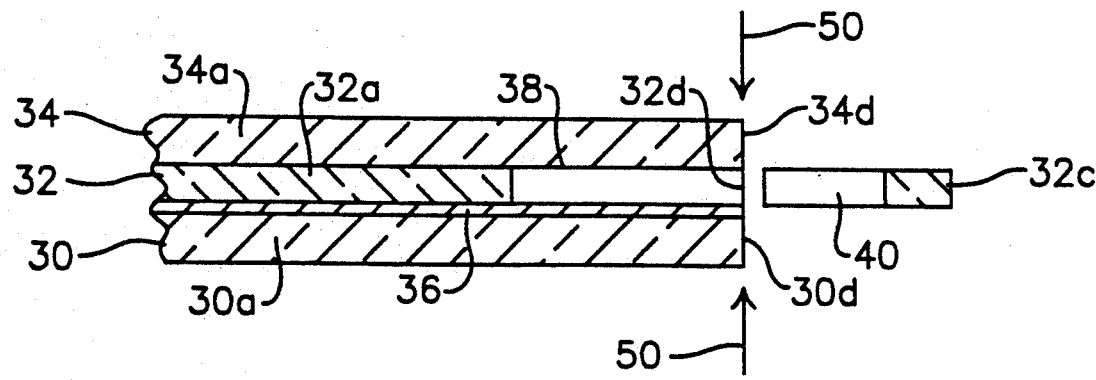

In the second method of the invention, the retaining pin 42 is enclosed within the sheets 30, 32 and 34 after lamination. FIGS. 7, 8 and 9 illustrate how the sacrificial areas 30b, 32b and 34b and the retaining pin 42 are removed to produce a structure which is essentially similar to the structure 24 described above.

In FIG. 7, a hot knife, shear, laser, saw or the like is used to cut through the sheets 30 and 34 at the edges 30d, 32d and 34d thereof down to the retaining pin 42 as indicated by arrows 46, and the sacrificial areas 30c and 34c are removed. The sacrificial area 32c of the sheet 32 remains after this step.

As illustrated in FIG. 8, the upper and lower surfaces of the portion of the pin 42 in the cavity 40 in the sacrificial area 32c are exposed after performing the step of FIG. 7. This portion of the pin 42 may be pushed upwardly as shown in the drawing (or alternatively downwardly) and gripped, and the pin 42 pulled out of the cavities 38 and 40 as indicated by an arrow 48. Then, as illustrated in FIG. 9, the sacrificial area 32c is cut away from the top and/or bottom as indicated by arrows 50. The remaining portions of the sacrificial areas 30b, 32b and 34b may be cut away and removed by sawing or the like in conjunction with any of the steps of FIGS. 7, 8 or 9 or at a subsequent time to produce a multilayer structure essentially similar to the structure 24 having the open cavity 38 into which a conductive pin may be inserted and ohmically adhered to the stripline 36.

Figure 10:
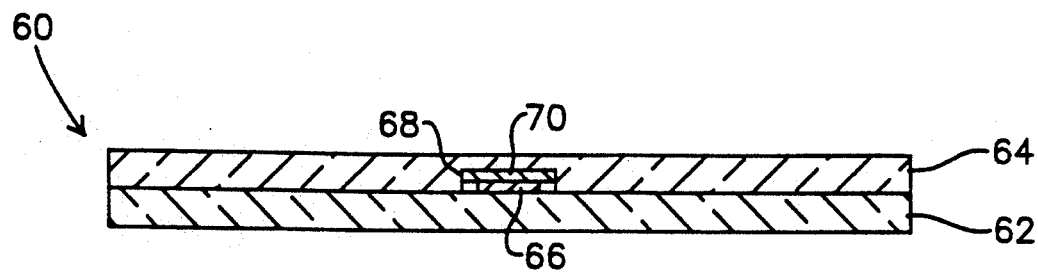
FIGS. 10 and 11 are sectional views illustrating alternative multilayer electrical circuit structures fabricated in accordance with a method of the present invention.

Whereas the cavities in the embodiments described above are formed completely through one sheet, it is within the scope of the invention to form a cavity partially through one sheet, or through two or more sheets. As illustrated in FIG. 10, a multilayer electrical circuit structure 60 includes laminated sheets 62 and 64. A stripline 66 is formed on the sheet 62, whereas a cavity 68 is formed in the lower surface of the sheet 64 in alignment with and facing the stripline 66. An electrically conductive pin 70 is inserted into the cavity 68 and ohmically bonded to the stripline 66.

Figure 11:
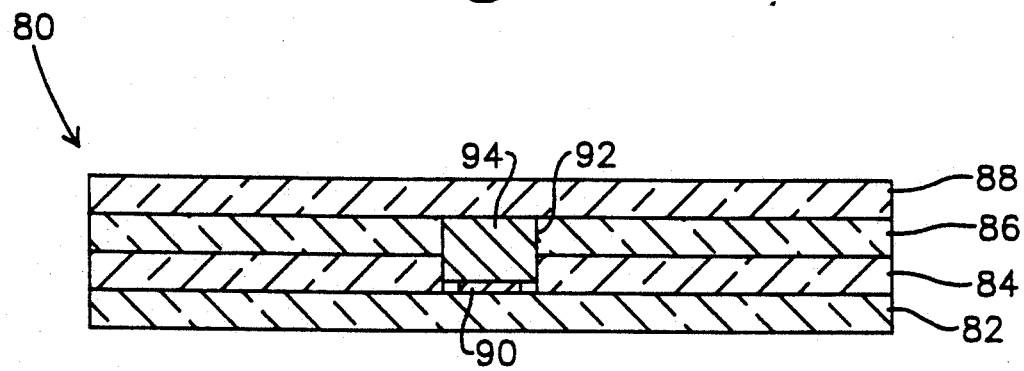

As illustrated in FIG. 11, a multilayer electrical circuit structure 80 includes laminated sheets 82, 84, 86 and 88. A stripline 90 is formed on the sheet 82, whereas a cavity 92 is formed through the sheets 84 and 86 in alignment with and facing the stripline 90. An electrically conductive pin 94 is inserted into the cavity 92 and ohmically bonded to the stripline 90.

EXAMPLE

Figure 12:
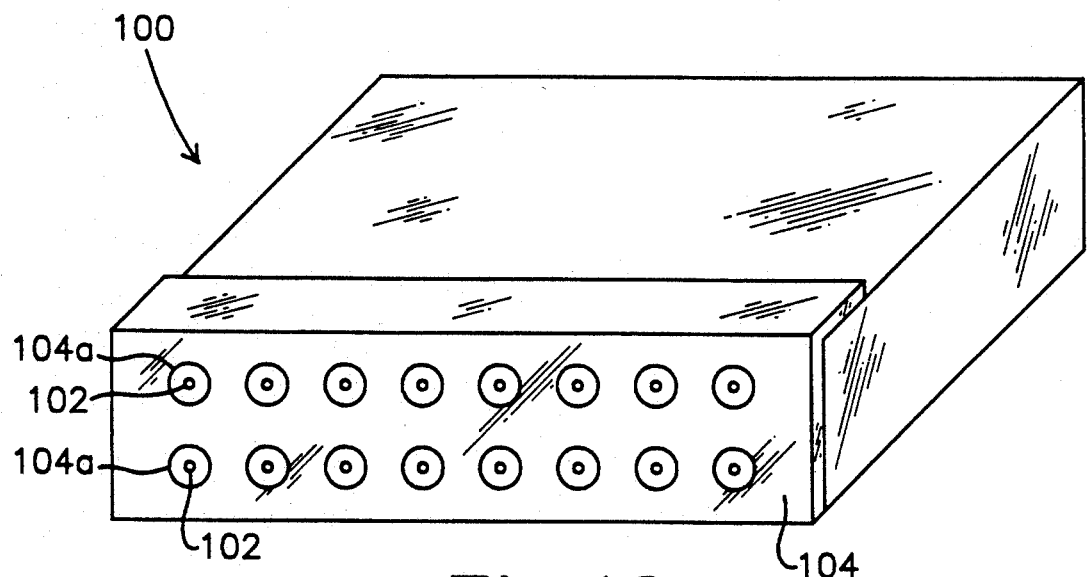
FIG. 12 is an isometric view of a multilayer electrical circuit structure embodying the present invention including a multiple connector pin arrangement.

A multilayer electrical circuit structure 100 embodying the present invention was fabricated as illustrated in FIG. 12. Although not visible in the drawing, the structure 100 was formed of 25 sheets of LTCC tape, each sheet being 0.25 mm thick. Two rows of cavities were formed through two sheets respectively, each cavity being 0.25 mm high (the thickness of one sheet), 0.50 mm wide and 6.1 mm long. Electrically conductive pins 102 made of gold plated beryllium-copper alloy were ohmically adhered to striplines (not visible) in the structure 100 using EPO-TEK H35-175 conductive epoxy resin manufactured by Epoxy Technology, Inc. of Billerica, Mass. The resin was cured for two hours at 165° C.

An electrically conductive capture or shroud plate 104 formed with holes 104a through which the pins 102 protrude was attached to the laminated sheets. The holes 104a were shaped to receive GPO connector plugs manufactured by Gilbert Engineering of Glendale, Ariz. The structure 100 provided satisfactory interconnections as tested with a Hewlett Packard HP8510B Network Analyzer up to a frequency of 18 Ghz.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A method of fabricating a multilayer electrical circuit structure, comprising the steps of:
   (a) providing first and second sheets having circuit areas;
   (b) forming an electrically conductive stripline on the first sheet, a portion of the stripline extending adjacent to an edge of the circuit area of the first sheet;
   (c) forming a cavity in the second sheet, the cavity opening at an edge of the circuit area of the second sheet;
   (d) adhering the first and second sheets together with said edges thereof aligned and the cavity aligned with and facing said portion of the stripline;
   (e) inserting a portion of an electrically conductive pin into the cavity; and
   (f) ohmically adhering said portion of the conductive pin to said portion of the stripline.

2. A method as in claim 1, further comprising the steps of:
   (g) between steps (c) and (d), inserting a retaining pin having approximately the same profile as the cavity into the cavity; and
   (h) between steps (d) and (e), removing the retaining pin from the cavity.

3. A method as in claim 2, in which step (d) comprises isostatic lamination.

4. A method as in claim 1, in which:
   step (a) further comprises providing a third sheet having a circuit area with an edge;
   step (c) comprises forming the cavity through the second sheet; and
   step (d) comprises adhering the second sheet between the first sheet and the third sheet with said edges thereof aligned.

5. A method as in claim 1, in which:
   step (a) comprises providing the first and second sheets in the form of thermally fusible tape;
   step (d) comprises lamination; and
   the method further comprises the step of:
   (g) between steps (d) and (e), heating the first and second sheets to thermally fuse them together.

6. A method as in claim 1, in which:
   step (a) comprises providing the first and second sheets as including sacrificial areas extending outwardly from said edges of the circuit areas thereof; and
   the method further comprises the step of:
   (g) between steps (d) and (e), removing the sacrificial areas from the first and second sheets.

7. A method as in claim 1, in which:
   step (a) comprises providing the first and second sheets as including sacrificial areas extending outwardly from said edges of the circuit areas thereof, and providing a third sheet as including a circuit area and a sacrificial area extending outwardly from an edge of the circuit area thereof; and
   the method further comprises the steps of:
   (h) between steps (c) and (d), inserting a retaining pin having approximately the same profile as the cavity into the cavity;
   (i) between steps (d) and (e), removing the sacrificial areas of the first and third sheets;
   (j) between steps (i) and (e), removing the retaining pin from the cavity; and
   (k) between steps (j) and (e), removing the sacrificial area of the second sheet.

8. A method as in claim 7, in which:
   step (c) further comprises forming a cavity in the sacrificial area of the second sheet which opens into the cavity of the circuit area thereof;
   step (h) further comprises inserting the retaining pin as having a length which is substantially equal to the combined length of the cavities of the circuit and sacrificial areas into the cavities; and
   step (i) includes cutting through the first and third layers at said edges of the circuit areas thereof down to the retaining pin.

9. A method as in claim 1, in which step (f) includes adhering said portion of the conductive pin to said portion of the stripline using electrically conductive adhesive.

10. A method as in claim 1, in which:
    the method further comprises the step of:
    (g) between steps (d) and (e), injecting an electrically conductive adhesive into the cavity; and
    step (f) comprises curing the adhesive.

* * * * *